United States Patent
Emami et al.

[11] Patent Number: 5,949,821
[45] Date of Patent: Sep. 7, 1999

[54] METHOD AND APPARATUS FOR CORRECTING PHASE AND GAIN IMBALANCE BETWEEN IN-PHASE (I) AND QUADRATURE (Q) COMPONENTS OF A RECEIVED SIGNAL BASED ON A DETERMINATION OF PEAK AMPLITUDES

[75] Inventors: Shahriar Emami; Charles H. Carter, both of Sunrise, Fla.

[73] Assignee: Motorola, Inc., Schaumburg, Ill.

[21] Appl. No.: 08/691,188

[22] Filed: Aug. 5, 1996

[51] Int. Cl.$^6$ ........................................ H03H 7/30
[52] U.S. Cl. ...................... 375/235; 364/724.2; 333/28 T
[58] Field of Search ................... 375/235, 232, 375/230, 229; 364/724.2, 724.19; 333/18 R, 28 T

[56] References Cited

U.S. PATENT DOCUMENTS

| | | | |
|---|---|---|---|
| 4,122,448 | 10/1978 | Martin | 343/7 |
| 4,475,088 | 10/1984 | Beard | 331/25 |
| 5,263,196 | 11/1993 | Jasper | 455/324 |
| 5,345,472 | 9/1994 | Lee | 375/1 |
| 5,396,656 | 3/1995 | Jasper et al. | 455/295 |
| 5,414,699 | 5/1995 | Lee | 370/18 |
| 5,636,244 | 6/1997 | Goodson et al. | 375/231 |

*Primary Examiner*—Chi H. Pham
*Assistant Examiner*—William Luther
*Attorney, Agent, or Firm*—Andrew S. Fuller

[57] ABSTRACT

A communication device (100) includes an equalizer (126) for correcting imbalance between in-phase and quadrature components of a received signal. The equalizer (126) determines peak amplitude for the in-phase and quadrature components, and the phase imbalance between both components (440). At least one of the in-phase and quadrature components is adjusted based on a function of the phase imbalance, and of the ratio of peak amplitudes of the in-phase and quadrature components (450, 460).

9 Claims, 3 Drawing Sheets

METHOD AND APPARATUS FOR CORRECTING PHASE AND GAIN IMBALANCE BETWEEN IN-PHASE (I) AND QUADRATURE (Q) COMPONENTS OF A RECEIVED SIGNAL BASED ON A DETERMINATION OF PEAK AMPLITUDES

TECHNICAL FIELD

This invention relates in general to radio communication devices, and in particular, to radio communication devices that demodulate a signal using in-phase and quadrature components.

BACKGROUND

It is known to decompose a received signal into in-phase (I) and quadrature (Q) signal components for demodulation purposes. This approach may be used for signals modulated using frequency modulation (FM), quadrature amplitude modulation (QAM), and other such modulation techniques. Ideally, the I and Q components have identical amplitudes, and phases that differ by a particular amount.

In practical implementations, a signal may have I and Q components with dissimilar amplitudes, or the I and Q components may have a phase difference that is not ideal. Such deviations from the ideal phase difference and amplitude are commonly referred to as phase and amplitude imbalance. An imbalance may result from imperfections in circuitry, stray capacitance, signal routing, and the like. The imbalance may be introduced while receiving the modulated signal, or may originate during construction of the signal.

When phase or gain imbalance distorts the received signal, subsequent signal processing is impacted. The prior art has long used higher tolerance components in an attempt to avoid phase and/or amplitude imbalance between the I and Q components. Such an approach has significant cost impact and may still not adequately address the problem. Another prior art approach attempts to account for imbalance by estimating and removing such imbalance. One such approach is described in U.S. Pat. No. 5,396,656 issued on Mar. 7, 1995, to Jasper et al., for a Method For Determining Desired Components Of Quadrature Modulated Signals. Here, a closed loop feedback technique is used to continuously determine an error signal by updating estimates of an imbalance component until the magnitude of the error signal is negligible. Yet another approach is described in U.S. Pat. No. 4,122,448 issued on Oct. 24, 1978, to Martin, for an Automatic Phase And Gain Balance Controller For A Baseband Processor. Martin uses a pilot signal to obtain phase and amplitude imbalances, and these imbalances are corrected using a feedback circuit.

Prior art approaches to solving the problem of phase and amplitude imbalance between in-phase and quadrature components of a modulated signal vary in complexity and effectiveness. It is desired in the art to provide an effective solution with reduced circuitry and/or signal processing requirements. Therefore, a new method and apparatus for adjusting imbalance between in-phase and quadrature components of a received signal is needed.

DETAILED DESCRIPTION OF THE PREFERRED EMBODIMENT

The present invention provides a method and apparatus for correcting imbalance between in-phase and quadrature components of a received signal. In operation, the apparatus determines peak amplitudes for the in-phase and quadrature components of the received signal. The phase imbalance between the in-phase and quadrature components is determined using the peak amplitudes. The peak amplitudes and phase imbalance are used to adjust at least one of the in-phase and quadrature components to correct for any imbalance therebetween. Preferably, such operation is performed on blocks of in-phase and quadrature signal component data by a digital signal processor.

Figure 1:
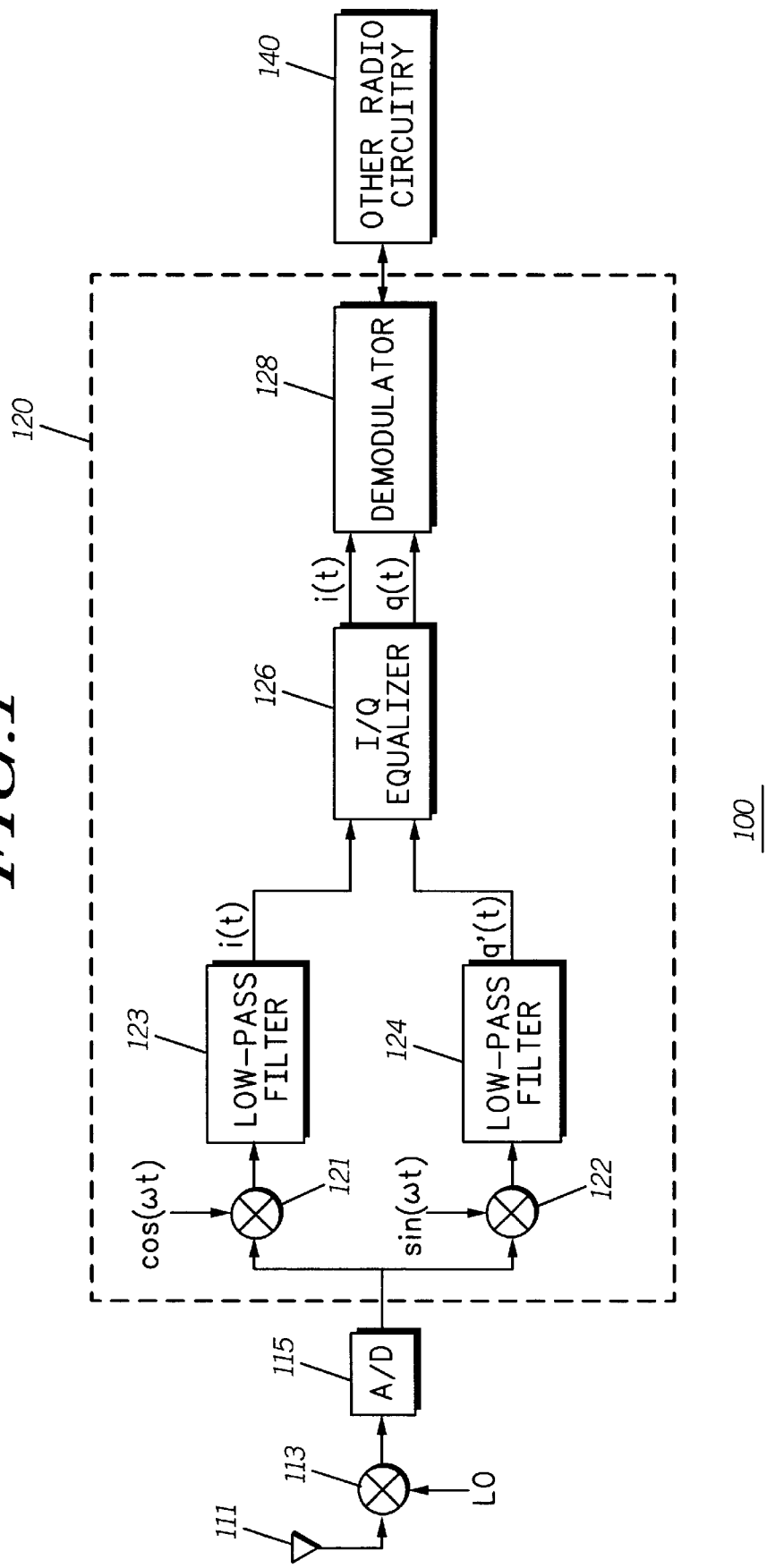
FIG. 1 is a block diagram of a communication device having a receiver, in accordance with the present invention.

FIG. 1 is a block diagram of a communication device 100, in accordance with the present invention. In the preferred embodiment, the communication device is a digital radio having circuitry for processing signals modulated using quadrature amplitude modulation (QAM). However, the concepts embodied by the present invention are equally applicable to other modulation schemes, such as frequency modulation, among others, where the modulated signal is decomposed into in-phase and quadrature components.

The radio communication device 100 includes an antenna 111, a mixer 113, an analog-to-digital (A/D) converter 115, and a digital signal processor (DSP) 120, that together function as a receiver. The communication device 100 further includes other radio circuitry 140 for generating and processing communication signals. In operation, the communication device 100 receives a modulated signal over a communication channel via the antenna 111. The signal is mixed with a local oscillator signal at mixer 113. The resultant analog signal is converted to a digital signal by the A/D converter 115. This digitally modulated signal is processed by the DSP 120 to extract the communicated information, and the extracted information further processed by the other radio circuitry 140.

The DSP 120 includes mixers 121, 122, low-pass filters 123, 124, an in-phase/quadrature (I/Q) equalizer 126, and a demodulator 128, among other elements not shown. The elements of the DSP 120 shown represent recognizable functional blocks which may be implemented in software or hardware as would be appreciated by those skilled in the art. The digitally modulated signal present at the output of the A/D converter 115 includes an in-phase signal component and a quadrature signal component. The in-phase signal component, referred to herein as i(t), is separated by mixing in a cos(wt) signal at mixer 121, and by filtering the mixed signal using the low-pass filter 123. Similarly, the quadrature signal component, referred to herein as q'(t), is separated by mixing in a sin(wt) signal at mixer 122, and by filtering this mixed signal by the low-pass filter 124. The in-phase and quadrature signal components are presented to the I/Q equalizer 126 which corrects for imbalance between the signal components before presentation at the demodulator 128.

Figure 2:
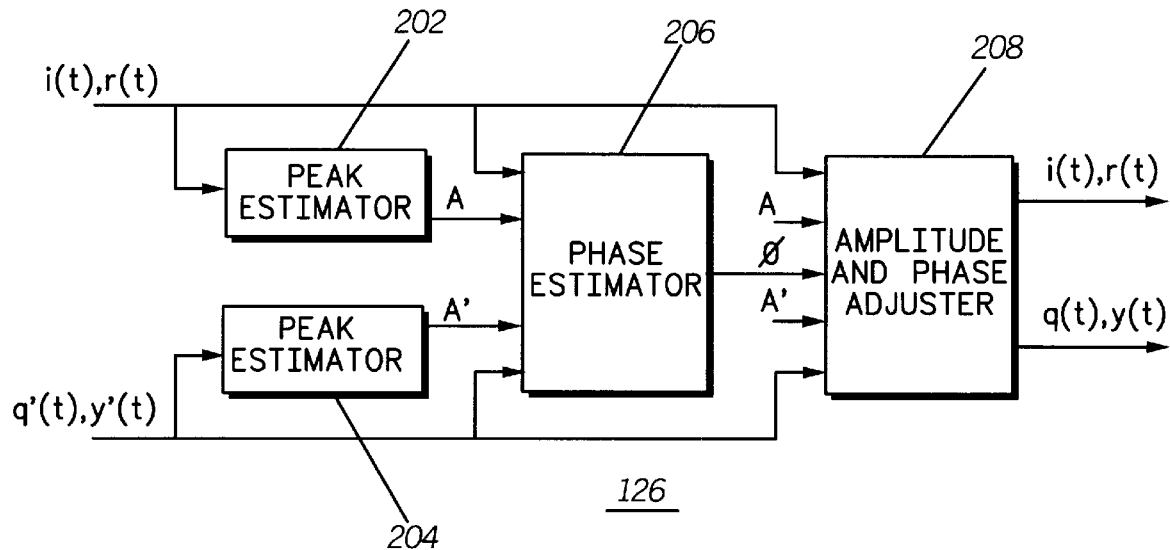
FIG. 2 is a block diagram of an equalizer for correcting phase and amplitude imbalance, in accordance with the present invention.

FIG. 2 is a block diagram of the I/Q equalizer 126, in accordance with the present invention. The I/Q equalizer 126 includes a peak estimator 202, 204, for each of the in-phase and quadrature components, a phase imbalance estimator 206, and an amplitude and phase adjuster 208. According to the present invention, at least one of the in-phase and quadrature components is adjusted to correct for imbalances between both signal components. Preferably, one of the in-phase and quadrature signal components is selected as a reference signal component, r(t), and the other signal component selected as the unbalanced signal component, y'(t), i.e., the signal component to be adjusted. In the preferred embodiment, the in-phase component is selected as reference signal component, and the quadrature component selected as the unbalanced signal component. Thus, as used in the description below: r(t)=i(t); and y'(t)=q'(t), where the prime (') designator indicates the status of the signal component before correction or adjustment.

In operation, the digitally modulated signal from the A/D converter 115 (see FIG. 1) is separated into blocks of in-phase and quadrature component data, which may represent data frames, or other such designations. Generally, the data constitutes samples of the in-phase or quadrature signal component. A block of in-phase component data is processed together with a corresponding block of quadrature data by the I/Q equalizer 126 according to the present invention. The peak estimators 202, 204 operate to determine peak amplitudes for the in-phase and quadrature signal components, respectively. Preferably, the peak estimator operates by detecting amplitude peaks within the block of in-phase or quadrature data, and by averaging the amplitude peaks to obtain a peak amplitude estimate. The peak amplitude estimates for the r(t) and y'(t) components are designated herein as A and A', respectively.

The phase estimator 206 operates to estimate the phase imbalance between the in-phase and quadrature signal components. In the preferred embodiment, the phase imbalance, designated as $\phi$, is determined by the equation:

$$\phi = \arcsin\left(\frac{2}{AA'}\overline{r(t)y'(t)}\right) \quad [1]$$

where $\overline{r(t)y'(t)}$ represents the cross-correlation between r(t), and y'(t). Thus, in the preferred embodiment, where r(t)=i(t), and y'(t)=q'(t):

$$\phi = \arcsin\left(\frac{2}{AA'}\overline{i(t)q'(t)}\right),$$

where $\overline{i(t)q'(t)}$ represents cross-correlation between i(t) and q'(t). The phase imbalance $\phi$, along with the peak amplitude estimates A, A' are used to generate a corrected or adjusted signal component.

Figure 3:
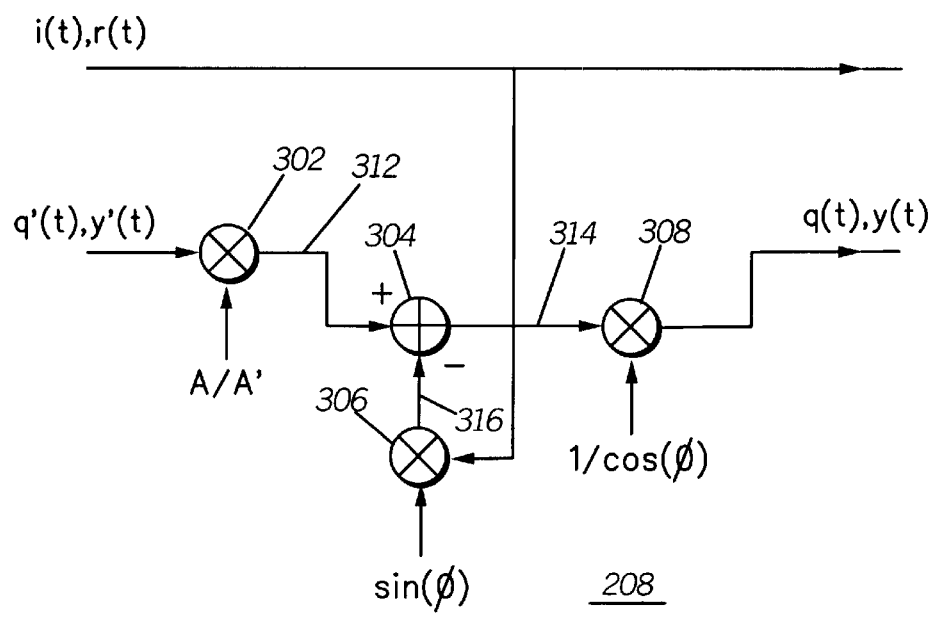
FIG. 3 is a circuit diagram of an amplitude and phase adjuster within the equalizer of FIG. 2, in accordance with the present invention.

FIG. 3 shows a circuit diagram of the amplitude and phase adjuster 208, in accordance with the present invention. The amplitude and phase adjuster 208 operates to generate an adjusted or corrected unbalanced signal component, y(t), determined by the equation:

$$y(t) = \left(\frac{A}{A'}y'(t) - r(t)\sin\phi\right)\Big/(\cos\phi). \quad [2]$$

Thus, in the preferred embodiment where r(t)=i(t), y'(t)=q'(t), and y(t)=q(t):

$$q(t) = \left(\frac{A}{A'}q'(t) - i(t)\sin\phi\right)\Big/(\cos\phi).$$

Accordingly, the unbalanced signal component y'(t) is coupled to a mixer 302 which mixes in a signal A/A' to obtain an intermediate signal 312. Hence, the unbalanced signal component is scaled by a scaling factor of the ratio of the peak amplitude, A, of the reference signal component to the peak amplitude, A', of the unbalanced signal component. The intermediate result or signal 312 is coupled to a summer 304. The reference signal component is scaled at mixer 306 by a scaling factor of sin $\phi$, and the resultant intermediate signal 316 is subtracted from the signal 312 from mixer 302 to generate an intermediate signal 314. The output 314 of the summer 304 is scaled by 1/cos $\phi$ at mixer 308 to generate the adjusted or corrected unbalanced signal component, y(t).

Figure 4:
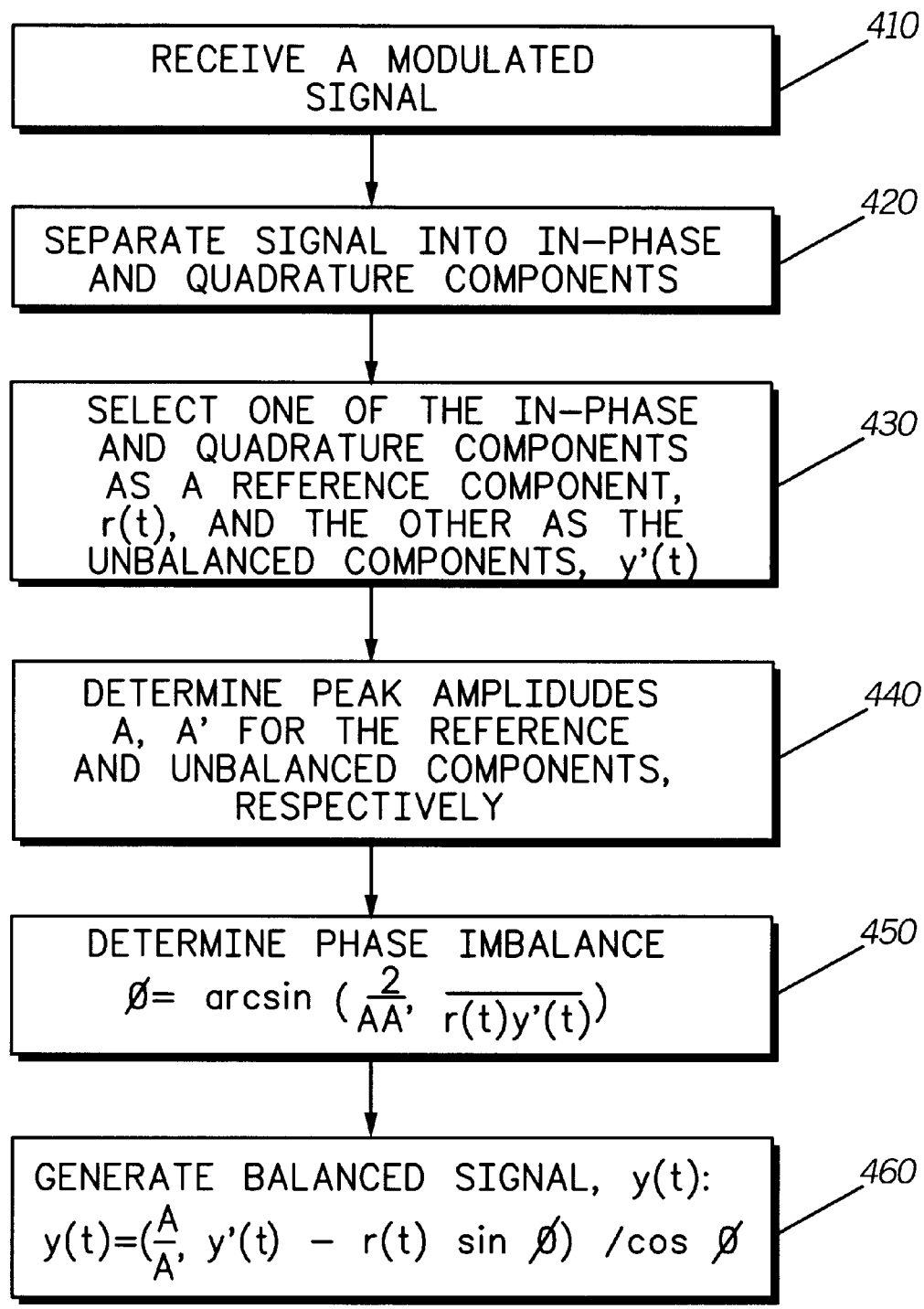
FIG. 4 is a flowchart of procedures used by the receiver of FIG. 1 to adjust for imbalance between in-phase and quadrature components, in accordance with the present invention.

FIG. 4 is a flowchart 400 summarizing the procedures used by a communication device in correcting for imbalance between in-phase and quadrature components of a modulated signal, in accordance with the present invention. The communication device receives a communication signal, which signal is modulated using quadrature amplitude modulation, step 410. The modulated signal is separated into in-phase and quadrature components, step 420. Preferably, one of the in-phase and quadrature signal components is selected as a reference signal component and the other treated as the unbalanced signal component, step 430. In the preferred embodiment, the reference signal component is the in-phase signal component, and the presumably unbalanced signal component is the quadrature signal component. The unbalanced signal component is adjusted, by adjusting amplitude based on a difference in peak amplitudes between the in-phase and quadrature components, and by adjusting phase by a function based on the phase imbalance between the signal components. Peak amplitudes A, A' are determined for the reference and unbalanced signal components, respectively, step 440. The phase imbalance between the reference and unbalanced signal components is determined, preferably according to equation[1] above, step 450.

The unbalanced component is scaled by a factor based on the ratio of peak amplitudes for the unbalanced and referenced signal components. The reference signal component is scaled by a factor of sin $\phi$. A scaling factor of 1/cos $\phi$ is applied to the difference between the scaled reference signal component and the scaled unbalanced signal component to generate a corrected or adjusted unbalanced signal component, step 460. Thus, a balanced version of the unbalanced signal component is generated, preferably according to equation[2] above. The corrected in-phase and quadrature components are then coupled as inputs to the demodulator, which provides a demodulated signal. The demodulated signal is then processed by other radio circuitry.

The present invention provides significant benefits over the prior art. By digitally processing the modulated data to remove phase and/or amplitude imbalance between the in-phase and quadrature components, further processing of the modulated signal is facilitated. The procedures for imbalance correction of the present invention lend themselves to implementation within a digital signal processor without substantial complexity.

What is claimed is:

1. A method for correcting imbalance between in-phase and quadrature components of a received signal, comprising the steps of:

determining peak amplitudes for the in-phase and quadrature components of the received signal;

determining phase imbalance between the in-phase and quadrature components of the received signal;

adjusting at least one of the in-phase and quadrature components, including the steps of:

selecting one of the in-phase and quadrature components as an unbalanced signal component, and another of the in-phase and quadrature components as a reference signal component;

scaling the unbalanced signal component by a scaling factor based on a ratio of peak amplitudes for the unbalanced and reference signal components;

scaling the reference signal component by a scaling factor of sin $\phi$;

applying a scaling factor of 1/cos $\phi$ to a difference between the scaled reference signal component and the scaled unbalanced signal component;

adjusting amplitude of the at least one of the in-phase and quadrature components based on a difference in peak amplitudes between the in-phase and quadrature components; and adjusting phase of the at least one of the in-phase and quadrature components using a function based on the phase imbalance.

2. In a communication device, a method comprising the steps of:

receiving a composite signal having modulated data;

separating the composite signal into in-phase and quadrature components;

determining a phase imbalance, $\phi$, between the in-phase and quadrature components;

selecting one of the in-phase and quadrature components as an unbalanced signal component, and another of in-phase and quadrature components as a reference signal component;

scaling the unbalanced signal component by a scaling factor based on a ratio of the reference signal component to the unbalanced signal component to obtain a first intermediate result;

scaling the reference signal component by a scaling factor of sin $\phi$ to obtain a second intermediate result;

subtracting the second intermediate result from the first intermediate result to obtain a third intermediate result;

scaling the third intermediate result by a scaling factor of 1/cos $\phi$ to obtain an adjusted unbalanced signal component; and demodulating the reference signal component and the adjusted unbalanced signal component to recover modulated data.

3. A method for correcting imbalance between in-phase and quadrature components of a received signal, comprising the steps of:

obtaining a block of data digitally modulated to have an in-phase component and a quadrature component;

selecting one of the in-phase and quadrature components as an unbalanced signal component, y'(t), and another of in-phase and quadrature components as a reference signal component, r(t);

digitally processing the block of data, including the steps of:

detecting amplitude peaks for r(t) and y'(t), respectively, within the block of data;

averaging the amplitude peaks for r(t) to obtain a peak amplitude estimate, A;

averaging the amplitude peaks for y'(t) to obtain a peak amplitude estimate, A';

estimating phase imbalance, $\phi$, between r(t) and y'(t), wherein:

$$\phi = \arcsin\left(\frac{2}{AA'}\overline{r(t)y'(t)}\right),$$

where $\overline{r(t)y'(t)}$ represents cross-correlation between r(t) and y'(t); and generating an adjusted quadrature component, y(t), wherein:

$$y(t) = \left(\frac{A}{A'}y'(t) - r(t)\sin\phi\right) / (\cos\phi).$$

4. The method of claim 3, wherein the step of selecting comprises the steps of:

selecting the quadrature component as the unbalanced signal component; and selecting the in-phase component as the reference signal component.

5. A communication device having an equalizer for correcting imbalance between in-phase and quadrature components of a received signal, comprising:

a peak estimator that estimates peak amplitudes of the in-phase and quadrature components of the received signal;

a phase estimator that estimates phase imbalance between the in-phase and quadrature components of the received signal; and an adjuster responsive to the in-phase and quadrature components to adjust amplitude of at least one of the in-phase and quadrature components based on a ratio of peak amplitudes of the in-phase and quadrature components, and to adjust phase of at least one of the in-phase and quadrature components based on phase imbalance between the in-phase and quadrature components;

wherein the equalizer operates on one of the in-phase and quadrature components as a reference signal, r(t), and another of the in-phase and quadrature components as an unbalanced signal, y'(t), using the phase imbalance to obtain a corrected quadrature component, y(t), such that:

$$y(t) = \left(\frac{A}{A'}y'(t) - r(t)\sin\phi\right) / (\cos\phi),$$

where $\phi$ is the phase imbalance, and A and A' are estimates for peak amplitudes of the in-phase and quadrature components, respectively.

6. The communication device of claim 5, wherein:

$$\phi = \arcsin\left(\frac{2}{AA'}\overline{r(t)y'(t)}\right),$$

where $\overline{r(t)y'(t)}$ represents cross-correlation between r(t) and y'(t).

7. The communication device of claim 5, further comprising a demodulator, wherein the in-phase component and the corrected quadrature component are coupled as inputs to the demodulator.

8. A method for correcting imbalance between in-phase and quadrature components of a received signal, comprising the steps of:

determining peak amplitudes for the in-phase and quadrature components a block of data representing the received signal for a specific non-instantaneous duration of time, and isolating values identified with the respective peak amplitudes;

determining phase imbalance between the in-phase and quadrature components of the received signal, wherein the phase imbalance is derived from a function based at least in the isolated peak amplitude values for the in-phase and quadrature components of the received signal; and adjusting at least one of the in-phase and quadrature components, including the steps of:

adjusting amplitude of the at least one of the in-phase and quadrature components over the block of data representing the received signal based on a difference between the isolated peak amplitudes values of the in-phase and quadrature components, but not based on other non-peak amplitude values corresponding to the block data representing the received signal; and adjusting phase of the at least one of the in-phase and quadrature components using a function based on the phase imbalance.

9. A communication device having an equalizer for correcting imbalance between in-phase and quadrature components of a received signal, comprising:

a peak estimator that estimates peak amplitudes of the in-phase and quadrature components of a block of data representing the received signal for a specific non-instantaneous duration of time, and that isolates values identified with the respective peak amplitudes;

a phase estimator that estimates phase imbalance between the in-phase and quadrature components of the received signal, wherein the phase imbalance is derived from a function based at least in part on the isolated peak amplitude values for the in-phase and quadrature components of the received signal; and an adjuster responsive to the in-phase and quadrature components to adjust amplitude of at least one of the in-phase and quadrature components over the block of data representing the received signal based on a ratio of the isolated peak amplitude values of the in-phase and quadrature components but not based on non-peak amplitude values corresponding to the block of data representing the received signal, and to adjust phase of at least one of the in-phase and quadrature components based only on phase imbalance between the in-phase and quadrature components.

* * * * *